(12) United States Patent
Ohnhaeuser et al.

(10) Patent No.: US 7,965,218 B2
(45) Date of Patent: Jun. 21, 2011

(54) SAR ADC

(75) Inventors: Frank Ohnhaeuser, Stein (DE); Andreas Wickmann, Nuremberg (DE)

(73) Assignee: Texas Instruments Deutschland GmbH, Freising (DE)

( * ) Notice: Subject to any disclaimer, the term of this patent is extended or adjusted under 35 U.S.C. 154(b) by 30 days.

(21) Appl. No.: 12/511,250

(22) Filed: Jul. 29, 2009

(65) Prior Publication Data

US 2010/0026546 A1 Feb. 4, 2010

Related U.S. Application Data

(60) Provisional application No. 61/141,425, filed on Dec. 30, 2008.

(30) Foreign Application Priority Data

Jul. 29, 2008 (DE) .......................... 10 2008 035 215

(51) Int. Cl.
*H03M 1/12* (2006.01)
(52) U.S. Cl. ....................................... 341/172; 341/161
(58) Field of Classification Search .................. 341/172, 341/161, 155, 159
See application file for complete search history.

(56) References Cited

U.S. PATENT DOCUMENTS

| 6,124,818 | A | * | 9/2000 | Thomas et al. ............... 341/155 |
| 6,720,903 | B2 | | 4/2004 | Confalonieri et al. |
| 6,940,445 | B2 | | 9/2005 | Kearney |
| 7,015,841 | B2 | | 3/2006 | Yoshida et al. |
| 7,271,758 | B2 | | 9/2007 | Piasecki et al. |
| 2007/0035434 | A1 | | 2/2007 | Tachibana et al. |
| 2007/0090984 | A1 | * | 4/2007 | Lu et al. ........................ 341/155 |
| 2009/0027251 | A1 | | 1/2009 | Ohnhauser et al. |

FOREIGN PATENT DOCUMENTS

DE 10 2007 033 689 1/2009

* cited by examiner

*Primary Examiner* — Joseph Lauture
(74) *Attorney, Agent, or Firm* — John J. Patti; Wade J. Brady, III; Frederick J. Telecky, Jr.

(57) ABSTRACT

An electronic device is provided for analog to digital conversion using successive approximation. The device comprises a first ADC stage. The first ADC stage includes a first plurality of capacitors adapted to sample an input voltage, and adapted to be coupled to either a first reference signal level or a second reference signal level. At least one capacitor of the first plurality of capacitors is adapted to be left floating. A control stage is adapted to switch the at least one floating capacitor to the first reference signal level or the second reference signal level in response to an analog to digital conversion decision made by a second ADC stage.

9 Claims, 4 Drawing Sheets

SAR ADC

CROSS REFERENCE TO RELATED APPLICATIONS

This application is claims priority to German Patent Application No. 102008035215.2, filed on Jul. 29, 2008, and to U.S. Patent Application Ser. No. 61/141,425, filed on Dec. 30, 2008. Each application which is hereby incorporated by reference for all purposes.

TECHNICAL FIELD

The invention relates generally to an electronic device and, more particularly, to a successive approximation register (SAR) analog-to-digital converter (ADC).

BACKGROUND

Successive approximation is one of the techniques used for analog-to-digital conversion. The general functionality and operation of successive approximation register (SAR) analog-to-digital converters (ADCs) is well known in the art. SAR ADCs compare the analog input voltage to reference signal levels, which can be generated by a digital-to-analog converter (DAC). During a first clock cycle, the sampled input voltage may be compared to half the reference signal output by the DAC. If the result of the comparison indicates that the input voltage is greater than half the reference signal, then a respective bit decision relating to the most significant bit (MSB) is made. During the next clock cycle, the input voltage is compared to three quarters or one quarter of the reference signal in accordance with the preceding MSB decision, and a further bit decision is made relating to the next less significant bit. The conversion procedure carries on accordingly, and the DAC output voltage converges successively to the analog input voltage, while evaluating one bit during each clock cycle. The SAR ADC is arranged such that, when the conversion is completed, the digital number input to the DAC represents the digitized input voltage.

Referring to FIG. 1 of the drawings, the reference numeral 100 generally designates a conventional SAR ADC. The SAR ADC 100 comprises an ADC stage that is coupled to a SAR controller 102. The ADC stage generally includes a conventional CDAC 102 and comparator 104. The CDAC 102 has a positive side with sampling capacitors CP1 to CPN and a negative side with sampling capacitors CM1 to CMN. The capacitors CP1 and CM1 are adapted to evaluate the most significant bit or MSB and the capacitors CPN and CMN are adapted to evaluate the least significant bit or LSB. The common nodes of each of the capacitors CP1 to CPN and CM1 to CMN can be coupled to a common mode voltage VCM by sample and hold switches SCM1 and SCM2 and each respective input of comparator 104. The other side of each of the capacitors CP1 to CPN and CM1 to CMN can be coupled to a positive reference signal REFP, a negative reference signal REFM or a differential input signal INP and INN.

The analog input voltage can be sampled directly on the capacitors CP1 to CPN and CM1 to CMN by opening the switches SCM1 and SCM2 and coupling the inputs for signal INP and INN to the other side of some are all capacitors, such that a charge corresponding to the size of the capacitors and proportional to the amplitude of the input voltage is present on the sampling capacitors. The sampled charge is redistributed stepwise among the capacitors of the CDAC 102. The magnitude of the input voltage is basically determined by selectively and consecutively switching the other sides of the capacitors between the different reference signal levels REFP and REFM and comparing the established voltage level on the common nodes. The switching of the other side of each of the plurality of capacitors is performed through numerous switches SM1 to SMN and SP1 to SPN, which are controlled by control signals provided by control stage 106 in response to the output of comparator 104 at each step of the conversion process. The capacitors having the largest capacitance CP1 and CM1 will be the first to be coupled to a specific reference signal level, while the remaining capacitors CP2 to CPN and CM2 to CMN are coupled to another reference signal level. Then the voltage on the common nodes, which are coupled to respective positive and negative inputs of a comparator 104, is compared, and the output of the comparator 104 represents the bit values of the digital output word DOUT bit by bit, starting with the most significant bit. In accordance with the signal at the output of the comparator 104 (i.e., the comparison result), the capacitors CP1 to CPN and CM1 to CMN are consecutively coupled one-by-one to either the first or the second reference signal level REFP or REFM and remain in the position during the subsequent conversion steps. The intermediate results are stored in a register (successive approximation register) which resides together with other logic for controlling the analog-to-digital conversion process in a control stage referred to as successive approximation register or SAR controller 106. The controller 106 may have an input for receiving a clock signal CLK and an input for receiving a start signal START which indicates that conversion is to be started. The controller 106 provides the digital output word which represents the digital value of the sampled input voltage at output node DOUT.

Up-to-date electronic devices, and corresponding semiconductor manufacturing processes, typically use supply voltages of 5V or less in order to save power and to gain speed. The supply voltage limits the input signal range of the ADCs. In order to convert a +/−10V input signal, which is a typical industrial standard, the signal is divided either with a resistive divider or with a capacitive divider, so as to fit the input signal voltage range into the comparator's input voltage range, which can basically be between ground and the supply voltage level. However, the division of the input signal decreases the signal-to-noise ratio (SNR) of the ADC. With a 5V supply voltage range and an input range of, for example, +/−10V (i.e., a division by 4 is required for an input range of +/−10V), the LSB of a 16 bit converter corresponds to 76 μV, although it could amount to 305 μV if the signal was not divided. The input range could also be +/−5V or +/−12V, etc., for example. A typical up-to-date 16 bit SAR ADC has a noise level that corresponds to 2 to 6 LSBs at the output for any DC input voltage. In order to handle the relatively large input voltage range, high-voltage transistors are required. Typical 5V semiconductor manufacturing processes provide high-voltage transistors so that ADCs are available that have a high input voltage range even on a low voltage core that runs, for example, with the 5V supply voltage. However, dividing the input signal is always necessary, thereby decreasing the achievable SNR.

SUMMARY

In accordance with a preferred embodiment of the present invention, it provides an electronic device for analog to digital conversion using successive approximation. The device comprises a first ADC stage with a first plurality of capacitors. One side of at least one capacitor of the first plurality of capacitors is adapted to be left floating after sampling an input voltage on the first plurality of capacitors. However, more than one of the capacitors could also be left floating. A plurality of switches is provided for coupling a second side of each capacitor of the plurality of capacitors to a first reference signal level or a second reference signal level. A control stage is coupled to the first plurality of capacitors for coupling the at least one capacitor that is left floating to the first reference signal level or the second reference signal level in response to a conversion step performed by a second ADC stage.

In accordance with a preferred embodiment of the present invention, a high input voltage can be sampled on the first plurality of capacitors (i.e. on a capacitive array, which may be a capacitive digital to analog conversion stage of a SAR ADC) without having to divide the input voltage before performing the conversion. The first plurality of capacitors is coupled with one side to a common node through which charge is redistributed during conversion. The voltage on the common node must converge during the successive approximation procedure and should not exceed the comparator input range. In order to handle input voltage levels higher than the maximum input voltage range of the comparator, the first conversion step (or steps) is performed by another ADC, i.e. ADC stage 202. ADC stage 202 may be any kind of ADC and it may advantageously have a lower overall performance than the first ADC stage (i.e. it may have lower signal to noise ratio, resolution etc.). Therefore, the second analog to digital conversion step may need less chip area or calibration. The second analog digital conversion stage may advantageously be used for bit decisions relating to the floating capacitor(s) of the first ADC stage. The floating capacitor(s) in the first ADC stage is (are) coupled to reference signal levels (ground is also considered as a reference signal level) in accordance with the decisions made by ADC stage 202. The floating capacitor(s) and the first plurality of capacitors are dimensioned such that convergence of the successive approximation procedure is ensured when the floating capacitor(s) is (are) coupled to the respective reference level. Since the full electrical charge of the input voltage is sampled with the first ADC stage and since the entire sampled charge remains on the capacitors during conversion, there is no loss of SNR compared with ADC which divide the input voltage before conversion.

A first ADC stage with a first plurality of capacitors can be used, which may include a first set of capacitors and a second set of capacitors. A first side of each of the first plurality of capacitors may be couplable or coupled to a common node and a second side of at least one of the capacitors is firstly coupled to an input voltage and is then left floating during evaluation of the more significant bits (for example at least the first two bits) of the input voltage. This capacitor is known as a "floating" capacitor and it means that the charge (the input voltage) on the capacitor is frozen during evaluation of the more significant bits. However, more than one floating capacitor may be used. ADC stage 202 evaluates the value of these more significant bits of the input voltage while the capacitor in the first plurality of capacitors is left floating. According to the results of the evaluation, the "floating" side of the floating capacitor is then coupled to either a first or second reference signal level. If the input to the control stage (e.g. a comparator) changes, the respective bit in the register corresponding to the reference signal level to which the capacitor should be coupled changes in the next step of analog to digital conversion, so that the analog to digital conversion converges. For example, if the input voltage evaluated by the ADC stage is greater than a voltage level to which it is compared, the floating side of the capacitor may be coupled to a negative reference signal level, which pulls down the input voltage stored on the capacitor. If the bit value is evaluated to be less than the voltage level to which it is compared, the floating side of the capacitor may be coupled to a positive voltage level, which pulls up the input voltage stored on the capacitor. The rest of the analog to digital conversion is then run on the plurality of capacitors for the whole sampled charge. This means that the voltage remains within the allowed range when applied to the input nodes of a comparator, without the need to divide the input voltage. Therefore, the device of the present invention has an improved SNR compared to conventional devices.

In other words, a specific amount of sampled charge, which is frozen on the floating capacitor, is not used during the first bit or MSB decision steps, where high voltages can occur at the comparator input. However, as the charge is frozen, it can be used later during the conversion process, even though it did not contribute to the conversion process during the first step or during several of the first steps. These are the values of the most significant bits of the corresponding digital output word. After the first bit decisions are made by ADC stage 202, the floating capacitor or capacitors in the plurality of capacitors are coupled correctly to a specific reference signal in accordance with the bit values of the first decisions. Once the first most significant bit decision or decisions are made, the conversion procedure continues with the plurality of capacitors according to known successive approximation principles. However, as the floating capacitors hold additional charge, which is only activated during later decision steps, the loss in SNR due to dividing can be made small and even equal to zero. Accordingly, the floating capacitor (or even a plurality of floating capacitors) preferably represents a major part of the capacitance of the plurality of capacitors. Once the more significant bit decisions are made, the comparator input; i.e., the voltage at the common node, converges to an internal operating point, which is within the allowed voltage range and the complete charge can be activated; i.e., the frozen charge can be released so that the signal amplitude is nearly +/−10V again, but the internal nodes will not leave the allowed voltage ranges. The loss in terms of SNR is thereby substantially reduced compared with a conventional ADC.

In accordance with a preferred embodiment of the present invention, it also provides the advantage of a small error and any error that does arise may be corrected with a simple error correction scheme. Furthermore, the capacitors of the first ADC stage constitute only a small load on the reference input since the MSB capacitors (i.e. advantageously the floating capacitors) switch only a small number of times between the negative reference and the positive reference and the switching may not cause significant spikes or glitches at the comparator input. Glitching of the comparator inputs in the present invention is also irrelevant, since the capacitors are only switching once. More complex switching schemes may cause glitches and the comparator input nodes to rise above the supply voltage rail and/or below ground, which could discharge the nodes and cause forward biasing of diodes in the circuit, therefore leading to the capacitors being discharged. Here, the comparator input is kept in the allowed voltage range. Still further, the design of the device according to the present invention is uncomplicated and also minimizes time constraints so that the converter does not lose speed.

In accordance with a preferred embodiment of the present invention, the at least one capacitor that can be left floating may be adapted to represent one of the most significant bits. The most significant bit decision (as to whether to connect the floating capacitor to the first or the second reference signal) can thus be made by ADC stage 202 and the larger capacitors of the first plurality of capacitors only have to switch once, when the MSBs are evaluated by ADC stage 202.

In accordance with a preferred embodiment of the present invention, the control stage may be adapted to perform a dynamic error correction procedure. This provides a reliable error correction, which can be carried out for some bit decisions or after each bit decision. The error correction may be necessary to ensure convergence of the analog to digital conversion procedure in the first ADC stage since at least one of the MSB decisions is performed by ADC stage 202, which may have lower performance than the first ADC stage. However, the error correction scheme provides sufficient safety to ensure convergence, even with an additional low performance second ADC stage.

ADC stage 202 may be adapted to use successive approximation. Furthermore, ADC stage 202 may comprise a second plurality of capacitors. In an advantageous aspect of the invention, ADC stage 202 may be operable to divide the input voltage before it is converted. If only ADC stage 202 divides the input signal, there is no loss in performance with respect to the first ADC stage. If the first and ADC stage 202s are implemented in a similar manner with capacitive arrays, they may even share the same comparator. Therefore, a comparator may be provided having inputs coupled to the first plurality of capacitors and the second plurality of capacitors for making alternately bit decisions with respect to the first plurality of capacitors and the second plurality of capacitors.

In accordance with a preferred embodiment of the present invention, it also provides a method of analog to digital conversion using successive approximation. The method comprises sampling an input voltage on a first plurality of capacitors. The first plurality of capacitors is adapted to be coupled with one side to a common node. Another side of at least one capacitor of the first plurality of capacitors is left floating after the step of sampling. One or more analog to digital conversion steps are performed with ADC stage 202. The at least one floating capacitor of the first plurality of capacitors of the first ADC stage is coupled to a first reference signal or a second reference signal in accordance with the analog to digital conversion step of ADC stage 202. This means that the SNR of the first ADC stage can be as high as if no input signal division was required. The first plurality of capacitors is only switching once. Thus glitches are kept small, which means that the voltage at the input nodes stays within the allowable range. The input signal which is to be sampled may be divided in ADC stage 202 before performing the analog to digital conversion step with ADC stage 202 relating to the floating capacitor of the first ADC stage. This allows even lower voltage comparators to be used in the circuit, since the allowable voltage range is further reduced. An error correction procedure may be applied after having coupled the floating capacitor. The error correction basically provides that the first ADC stage identifies whether an error correction to the voltage on the at least one capacitor that is left floating should be positive or negative. Accordingly, an error correction is applied, and the error correction is tested. Error correction steps may be applied after one, several or after each step of coupling the at least one capacitor that is left floating to the reference signal. A simple error correction may be employed with the method in accordance with a preferred embodiment of the present invention.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
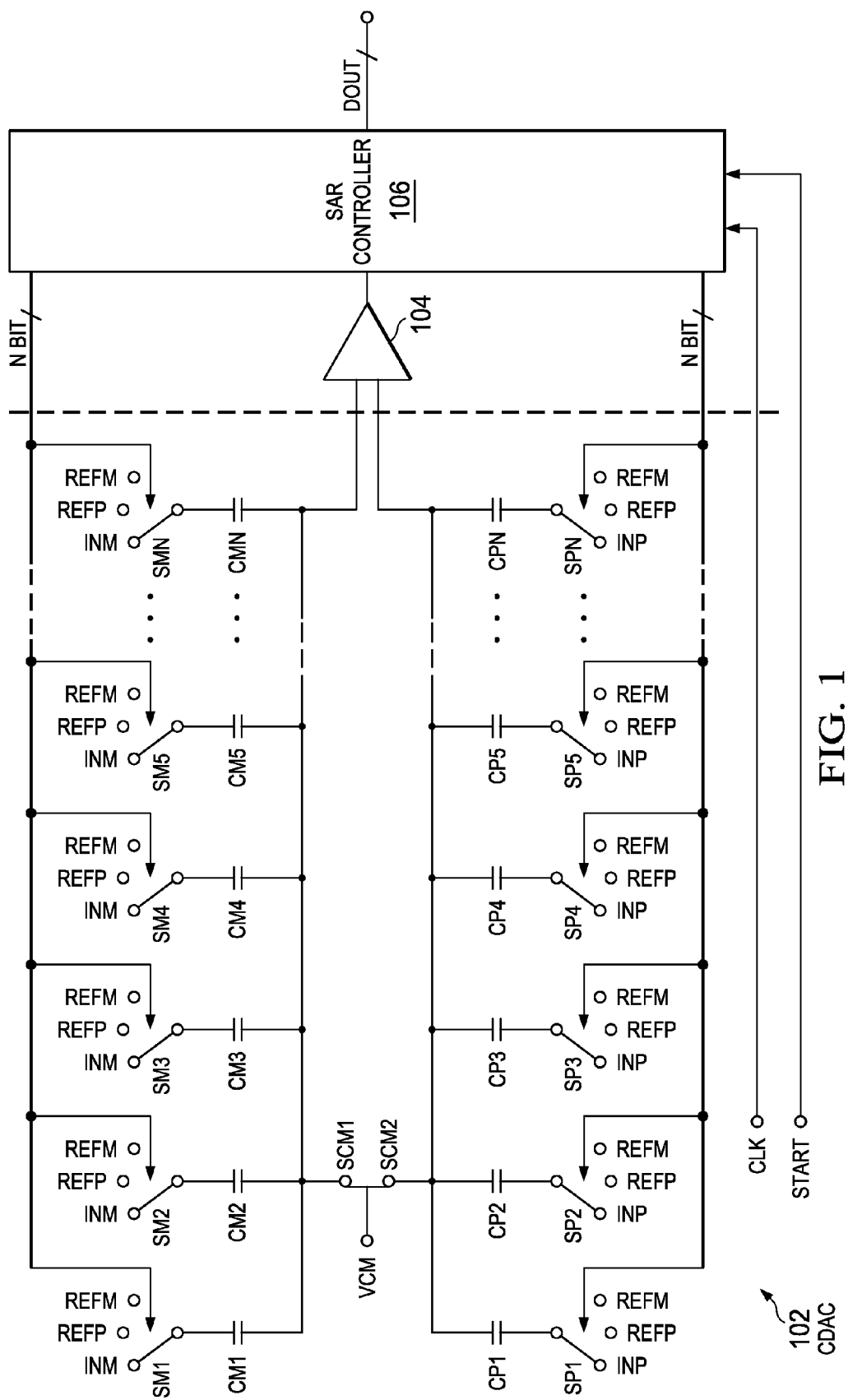
FIG. 1 is a simplified circuit diagram of a conventional successive approximation register (SAR) analog-to-digital converter (ADC)

Refer now to the drawings wherein depicted elements are, for the sake of clarity, not necessarily shown to scale and wherein like or similar elements are designated by the same reference numeral through the several views.

Figure 2:
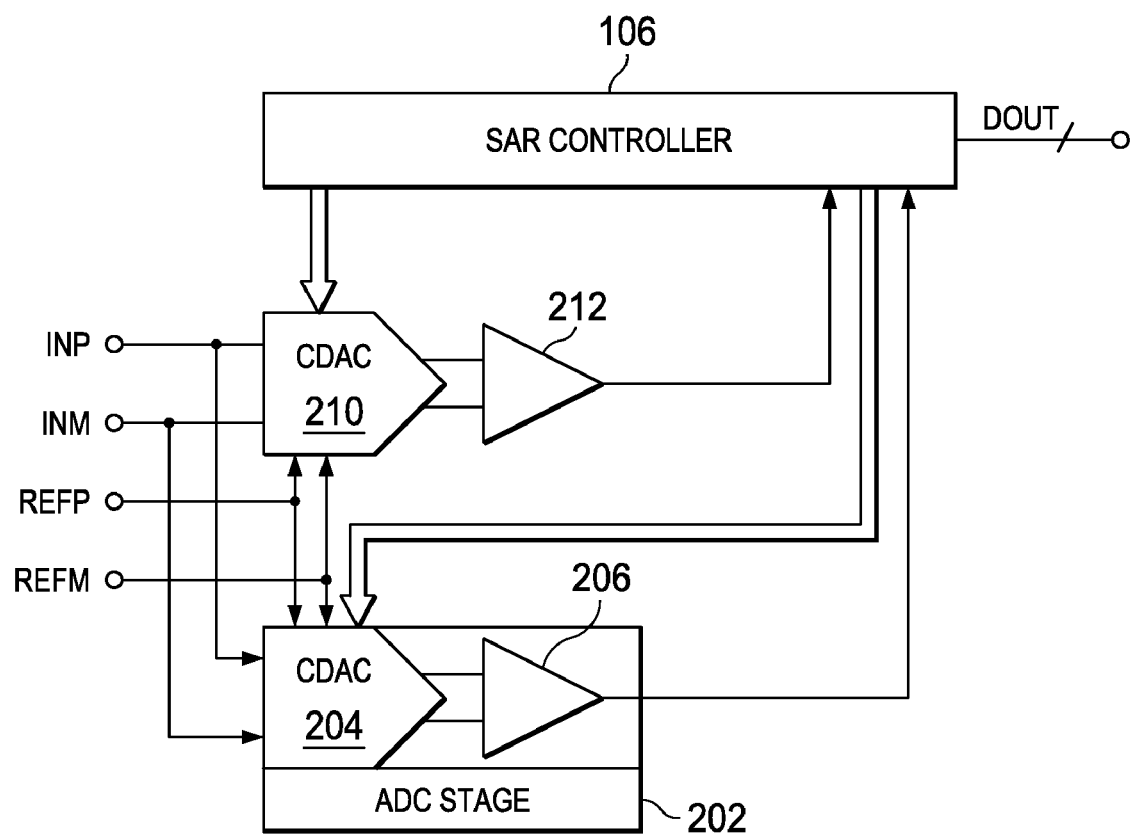
FIG. 2 is a simplified block diagram of a SAR ADC in accordance with a preferred embodiment of the present invention.

Referring to FIG. 2 of the drawings, the reference numeral 200 generally designates a successive approximation register (SAR) analog-to-digital converter (ADC) in accordance with a preferred embodiment of the present invention. A first ADC stage may include a switch capacitor array or capacitive digital-to-analog-converter (CDAC) 210 for evaluating bits of an analog-to-digital conversion. The array 210 may be coupled to comparator 212. Comparator 212 outputs a signal to a SAR controller 208, which may indicate the comparison result of comparator 212. ADC stage 202 can also be coupled to the SAR controller 208.

ADC stage 202 may be any kind of ADC stage. However, as shown, ADC stage 202 generally includes a CDAC or switched capacitor array 204 and comparator 206. ADC stage 202 provides a second output signal to SAR controller 208, which, as shown, is the comparison result of comparator 206. Arrays 210 and 204 receive positive input signal INP and a negative input signal INM, which are the two instances of a differential input signal. Arrays 210 and 204 also receive positive and negative reference signals REFP and REFM. Control signals are provided by SAR controller 208 in order to control the first ADC stage, in particular switches (not shown) in the first capacitive array 210 and in ADC stage 202.

Arrays 210 and 204 are arranged such that at least a partial or intermediate analog to digital conversion result (which is produced in one or more steps of the analog to digital conversion procedure) can be transferred to the SAR controller 208 and to the array 210. Comparator 206 forms part of the second analog digital conversion stage ADC. The output of comparator 206 provides an intermediate result of its own conversion procedure and this intermediate result is used by SAR controller 208 for issuing signals for coupling one side of one of the capacitors in array 210 that is left floating to the positive reference signal level REFP or the negative voltage reference level REFM.

The input voltage on input signals INP and INM is sampled using both array 210 and ADC stage 202. One or more capacitors used for sampling of array 210, which may have higher resolution than the ADC stage 202, are floating for the first cycles. The respective charge at inputs of comparator 212 is frozen. ADC stage 202 may divide the input voltage (from input signals INN and INP) and evaluates the value of the first bits (in this example at least the first two MSBs). According to the results of this evaluation, the capacitors in array 210, which have been left floating during the first step or steps, will be coupled to either the positive reference signal REFP or the negative reference signal REFM. When all floating capacitors are coupled, the remainder of the conversion may run on the capacitive array 210 with the entire sampled charge according to a normal successive approximation procedure. The errors resulting from offset, increased noise, gain and mismatch of the ADC stage 202 may be eliminated with dynamic error correction. The position of this error correction in the timing scheme of ADC 200 may depend on the expected size of the error after some conversion steps. However, at least one error correction step should be performed when the last floating capacitor is coupled to a reference signal in response to a conversion performed by ADC stage 202. As the requirements on resolution (such as SNR and so forth) on ADC stage 202 are lower than on the first ADC stage (which includes the floating capacitors), ADC stage 202 may be adapted to divide the input voltage (from input signals INN and INP).

The error produced after each evaluation step is very small and it is possible to achieve, for example, a ten-bit or more accuracy. As described below, any error that does arise can be eliminated with dynamic error correction after having coupled the floating capacitors. This renders synchronization easier. Although the ADC 200 in FIG. 2 is differential, it is also possible to apply the present invention on single-ended architectures.

Figure 3:
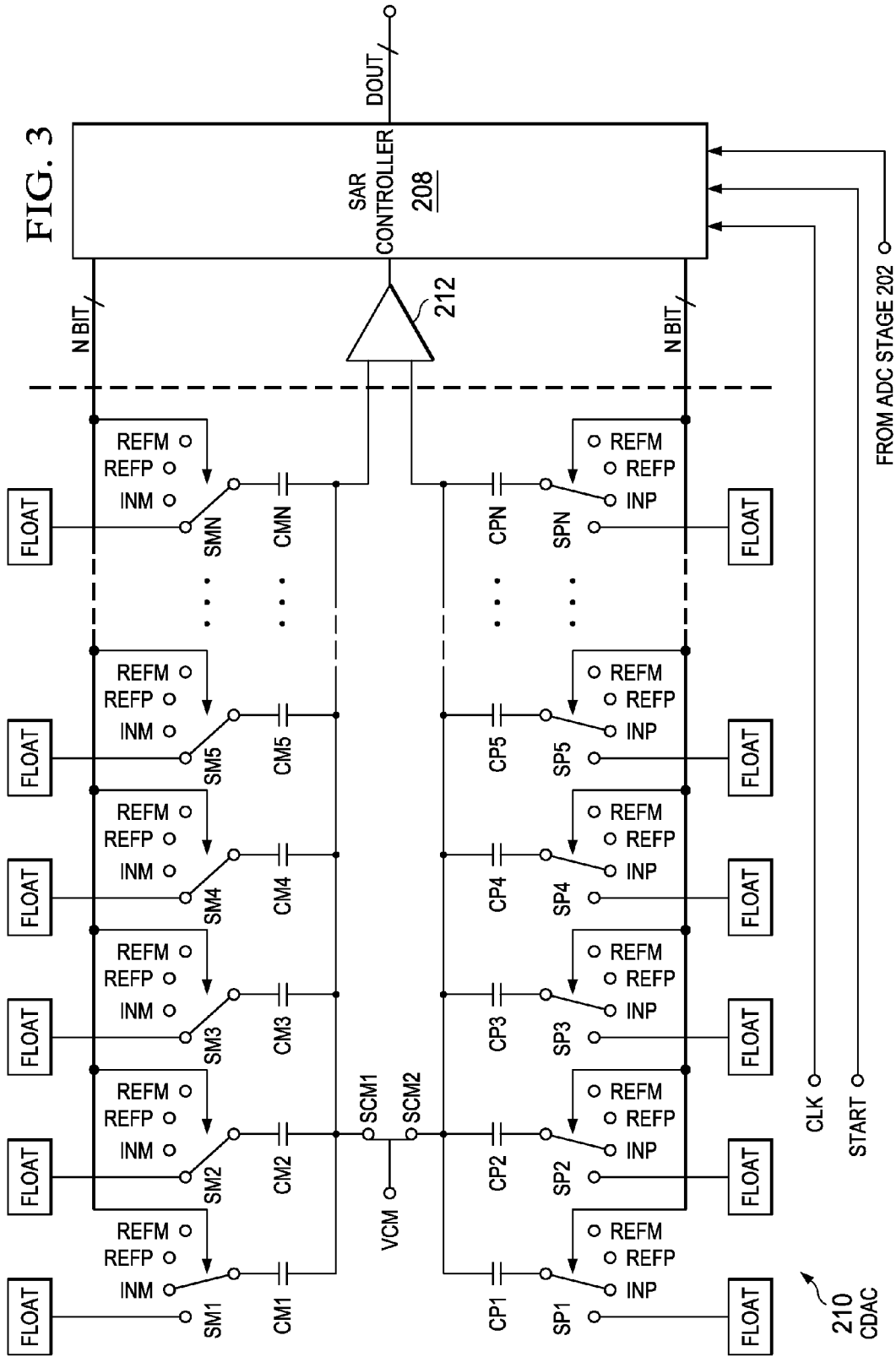
FIG. 3 is a simplified circuit diagram of the first ADC stage of FIG. 2.

FIG. 3 shows a simplified circuit of a first ADC stage shown in FIG. 2, which generally comprises array 210 and comparator 212. Array 210 has a positive side with sampling capacitors CP1 to CPN and a negative side with capacitors CM1 to CMN. The capacitors CP1 and CM1 are adapted to evaluate the most significant bit or MSB, and the capacitors CPN and CMN are adapted to evaluate the least significant bit or LSB. The capacitance values of capacitors CP1 to CPN and CM1 to CMN may be binary weighted. One side of each of the capacitors CP1 to CPN and CM1 to CMN can be coupled to a common mode voltage VCM by sample and hold switches SCM1 and SCM2. The other side of each of the capacitors CP1 to CPN and CM1 to CMN can be coupled through switches SP1 to SPN and SM1 to SMN to a positive reference signal REFP, a negative reference signal REFM or an input signal INP on the positive side and input signal INN on the negative side. As shown in FIG. 3, each of the capacitors CP1 to CPN and CM1 to CMN of the plurality of the capacitors can also be left floating. This option is indicated by an additional switch position FLOAT of switches SM1 to SMN and SP1 to SPN. If a switch resumes this position the respective side of the capacitors remains floating.

As previously described with respect to FIG. 1, also for FIG. 3, an analog input voltage can be sampled directly on the capacitors CP1 to CPN and CM1 to CMN by opening hold switches SCM1 and SCM2 after sampling, such that a charge corresponding to the size of the capacitors and proportional to the amplitude of the input voltage remains present on the capacitors used for sampling. However, in the next step some of the switches SM1 to SMN and SP1 to SPN may be turned to FLOAT (i.e., after the sampling step) so that the charge on the floating capacitors may not contribute in the first steps of the conversion procedure.

The SAR controller 208 may generally work as described with respect to the corresponding stage shown in FIG. 1. However, in this embodiment of the invention SAR controller 208 receives an additional input signal from ADC stage 202 (as shown in FIG. 2). Based on the information received from ADC stage 202, the floating capacitors are coupled to either reference signal REFM or REFP. ADC stage 202 performs one or more conversion steps. It may work separately and independently from the circuitry shown in FIG. 3. These conversion steps are advantageously one or more of the first conversion steps, during which the MSBs of the digital output word are determined. The corresponding information, which is determined in ADC stage 202 (ADC in FIG. 2), is passed with signal to SAR controller 208. By control signals the floating capacitors (i.e., the capacitors the setting of which is determined in ADC stage 202) are coupled to either reference signal REFP or REFM.

By switching the floating capacitors during the first steps to the correct reference signal level and the remaining capacitors in subsequent steps, which are performed according to the normal successive approximation procedure based on the output of comparator 212, the sampled charge is redistributed stepwise among the capacitors of array 210. Since the floating capacitors are directly coupled to the reference signal REFM or REFP, the voltage level on the common nodes is kept small. When the floating capacitors are coupled in the first ADC stage, the whole sampled charge can contribute during the charge redistribution and provides that the signal to noise ratio of the first ADC stage, as shown in FIG. 3, is the same as that of a SAR ADC having much greater power supply voltage range, or input voltage range of the comparator 212.

Figure 4:
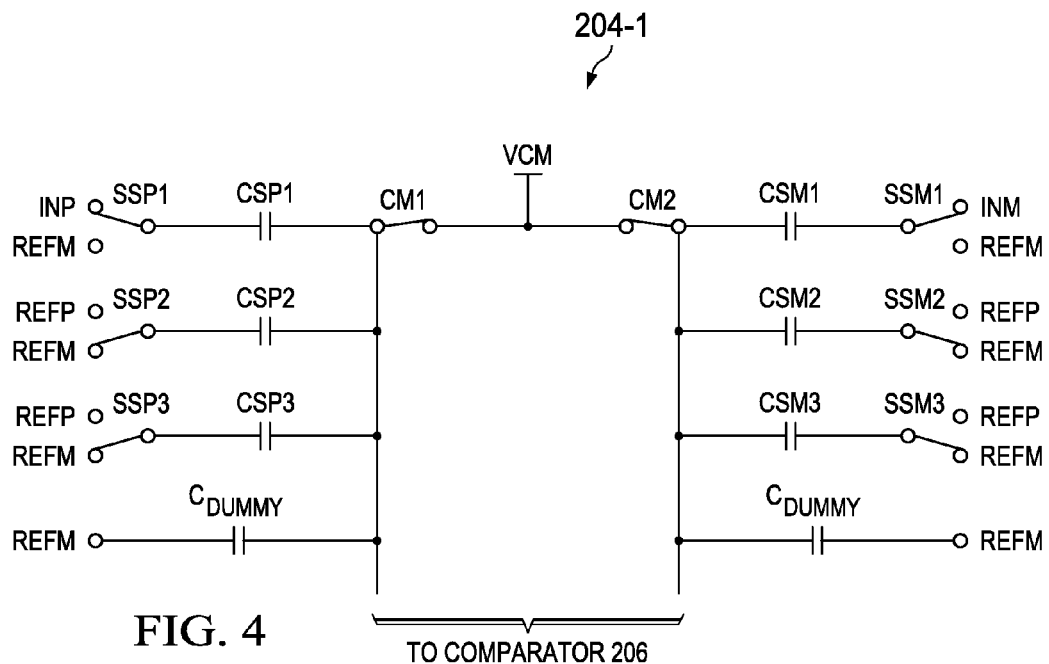
FIG. 4 is a simplified circuit diagram of ADC stage 202 of FIG. 2.

Generally, ADC stage 202 shown in FIG. 2 and referred to throughout the above description may be any kind of ADC. Turning to FIG. 4, an example of the switched capacitor array or CDAC 204-1 having two pluralities or sets of capacitors CSP1 to CSP3 and CSM1 and CSP3 (which can be binary weighted), and a pair of dummy capacitors $C_{DUMMY}$. As shown, capacitors CSP1 and CSM1 have a capacitance of Csp and Csm (respectively). Capacitors CSP2 and CSM2 have capacitance values equal to half of Csp and Csm (respectively), and capacitors CSP2 and CSM2 have capacitance values equal to a quarter of Csp and Csn (respectively). The positive and negative sampling capacitors CSP1 and CSM1 can be coupled to differential input signals INP and INM, if sampling switches CM1 and CM2 are closed in order to couple the sampling capacitors to a mid voltage or common mode voltage level VCM. Binary weighted capacitors can be switched between the positive and negative reference signals REFP and REFM, the sampling capacitors CSP1 and CSM1 can be switched between the input signal INP or INM, respectively, and the negative reference signal REFM, and the dummy capacitors $C_{DUMMY}$ on both the positive and negative sides of the capacitive array are coupled to the negative reference signal REFM. Coupling of the capacitors CSP1 and CSM1 to the negative reference signal REFM or the input signal INP or INN takes place via the switches SSP1 and SSM1, respectively. Capacitors CSP2 and CSM2 are coupled to the positive and negative reference signals REFP and REFM via respective switches SSP2 and SSM2, and capacitors CSP3 and CSM3 can be coupled to the positive and negative reference signals REFP and REFM via respective switches SSP3 and SSM3. Both the positive and negative sides of the array 204-1 can be coupled to a common mode voltage VCM via switches CM1 and CM2.

ADC stage 202 shown in FIG. 2 is involved in evaluating at least the first bit. However, the method of the present invention of using the ADC to make the more significant bit decisions can also be extended to evaluate more bits. Taking the positive side of the array 204-1 shown in FIG. 4 as an example, the positive input signal INP will be sampled on the positive sampling capacitor CSM1 while CM1 is closed. Stored charge on the positive common node can be calculated as $$Qsp=Csp(INP-VCM)+(3/4*Csp+C_{DUMMY})(REFM-VCM). \quad (1)$$

During the first decision, the positive sampling capacitor CSP1 is coupled to the negative reference signal REFM and the first binary weighted capacitor CSP2 is coupled to the positive reference signal REFP. Then the charge one the positive common node is $$Q1=(5/4*CSP+C_{DUMMY})*(REFM-VCPOS)+(3/4*CSP+C_{DUMMY})*(REFM-VCPOS), \quad (2)$$

where VCPOS is the voltage on the positive common node.

The maximum range of VCPOS can be adjusted with $C_{DUMMY}$ for a given positive reference signal REFP, a positive input signal INP and the voltage on the common node VCM. The same equations can be applied to the negative side of array 204-1 in the same manner. Array 204-1 uses the same high voltage reference as array 210. The gain error for the two positive arrays will be very similar. The total error of the ADC stage 202 depends on matching, offset, gain and noise. Any errors that do arise may be corrected using a very simple error correction scheme, as follows. After a bit decision, when any of the capacitors used for sampling that is left floating in the capacitive array 210 is coupled to either reference signal REFP or REFM, it is identified whether the error correction to the voltage on the floating sampling capacitor should be positive or negative. However, the additional components (such as the dummy capacitor $C_{DUMMY}$), the high voltage switches and level shifter require significant area on the die.

Figure 5:
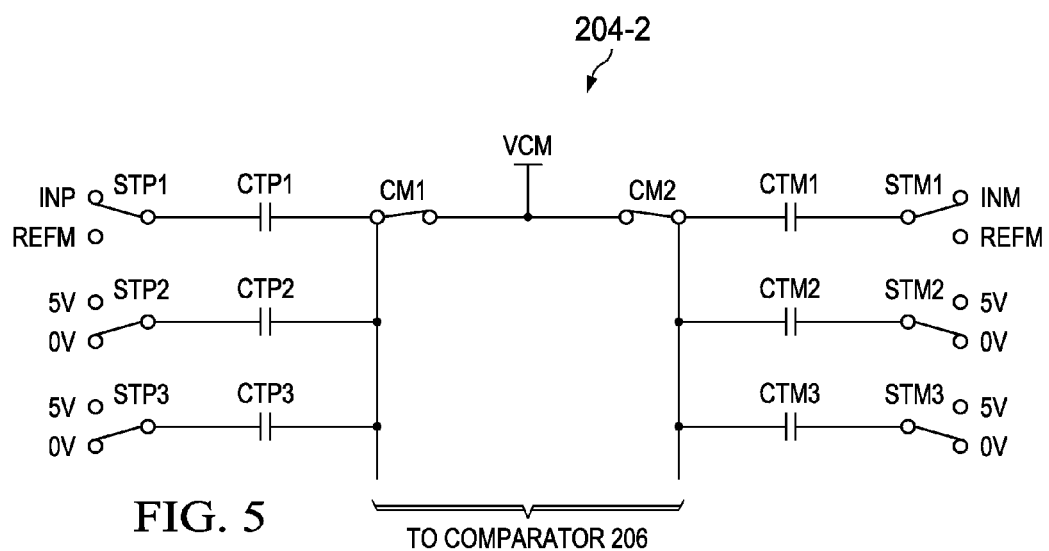
FIG. 5 is a second simplified circuit diagram of ADC stage 202 of FIG. 2.

Turning to FIG. 5, another example, array 204-2, is shown, which takes up less space and requires fewer components than that of the previous embodiment. The structure of array 204-2 is similar to array 204-1, but there are no dummy capacitors. Also, the sampling capacitor CTP1 or CTM1 is just half of the most significant bit capacitor CTP2 or CTM2, which is a binary weighted capacitor. The other binary weighted capacitor CTP3 or CTM3 is equal in value to the sampling capacitor CTP1 or CTM1. In this example, the input voltage from input signal INN and INP is from −10V to +10V. The sampling charge is divided by a factor of four. Two different references with very good matching are difficult to realize in practice and the capacitive array 210 and the ADC stage 202 will actually have different gain errors in this case. The difference in the gain errors will be the major part of the total error of the ADC stage 202. The dynamic error correction will then probably have to shift to a more significant bit, i.e. from bit 7 to bit 6, for example. However, an additional alternative would be to place a resistive divider at the input signal of the analog to digital converter ADC. This embodiment can also be used for input signals having a voltage range from 0 to 5V with a high common mode variation.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a first switched capacitor array that receives an input signal and a reference signal, wherein the first switched array is operable to provide the reference signal to its capacitors, to provide the input signal to its capacitor, or to allow its capacitors to float wherein the input and reference signals are differential, and wherein the first switched capacitor array further comprises a plurality of branches, and wherein each branch includes: a first capacitor that is coupled to the first comparator; a first switch that is coupled to the first capacitor and that receives a first portion of the input signal and a first portion of the reference signal, wherein the first switch is controlled by the SAR controller so as to provide the first portion of the input signal to the first capacitor, to provide the first portion of the reference signal to the first capacitor, or to allow the first capacitor to float; a second capacitor that is coupled to the first comparator; and a second switch that is coupled to the second capacitor and that receives a second portion of the input signal and a second portion of the reference signal, wherein the second switch is controlled by the SAR controller so as to provide the second portion of the input signal to the second capacitor, to provide the second portion of the reference signal to the second capacitor, or to allow the second capacitor to float;
    a second switched capacitor array that receives the input signal and the reference signal, wherein the second switched capacitor array is operable to provide the inputs signal to its capacitors or to provide the reference signal to its capacitors;
    a first comparator that is coupled to the first switched capacitor array;
    a second comparator that is coupled to the second switched capacitor array;
    a successive approximation register (SAR) controller that is coupled to the first switched capacitor array, the second switched capacitor array, the first comparator, and the second comparator, wherein the SAR controller controls each of the first and second switched capacitor arrays.

2. The apparatus of claim 1, wherein the second switched capacitor array further comprises a plurality of branches, wherein each branching includes:
    a first capacitor that is coupled to the second comparator;
    a first switch that is coupled to the first capacitor and that receives at least two of a first portion of the input signal, a first portion of the reference signal, and a second portion of the reference signal, wherein the first switch is controlled by the SAR controller;
    a second capacitor that is coupled to the second comparator; and
    a second switch that is coupled to the second capacitor and that receives at least two of a second portion of the input signal, the first portion of the reference signal, and the second portion of the reference signal, wherein the second switch is controlled by the SAR controller.

3. An apparatus comprising:
    a first switched capacitor array having a plurality of first branches, wherein each first branch includes:
        a first capacitor; and
        a first switch that coupled to the first capacitor and that receives an input signal and a reference signal, wherein the first switch is operable to provide at least one of the input signal and the reference signal to the first capacitor, and wherein the switch is operable to allow the first capacitor to float;

a second switched capacitor array having a plurality of second branches, wherein each second branch includes:
  a second capacitor; and
  a second switch that coupled to the second capacitor and that receives the input signal and the reference signal, wherein the second switch is operable to provide at least one of the input signal and the reference signal to the second capacitor;

a first comparator that is coupled to each of the first capacitors;

a second comparator that is coupled to each of the second capacitors; and a SAR controller that is coupled to the first and second comparators and to each of the first and second switches, wherein the SAR controller controls each of the first and second switches.

4. The apparatus of claim 3, wherein the input and reference signals are differential.

5. The apparatus of claim 4, wherein the second switched capacitor array has 3 branches that each include a pair of second capacitors and a pair of second switches.

6. The apparatus of claim 5, wherein the second switched capacitor array further comprises a dummy branch having a pair of dummy capacitors that each receive at least a portion of the reference signal and that are each coupled to the second comparator.

7. An apparatus comprising:
  a first comparator;
  a second comparator;
  a SAR controller that is coupled to each of the first and second comparators;
  a first switched capacitor array having a plurality of first branches, wherein each first branch includes:
    a first capacitor that is coupled to the first comparator;
    a first switch that is coupled to the first capacitor and that receives a first portion of an input signal and a first portion of a reference signal, wherein the first switch is controlled by the SAR controller so as to provide the first portion of the input signal to the first capacitor, to provide the first portion of the reference signal to the first capacitor, or to allow the first capacitor to float;
  a second capacitor that is coupled to the first comparator; and
  a second switch that is coupled to the second capacitor and that receives a second portion of the input signal and a second portion of the reference signal, wherein the second switch is controlled by the SAR controller so as to provide the second portion of the input signal to the second capacitor, to provide the second portion of the reference signal to the second capacitor, or to allow the second capacitor to float; and a second switched capacitor array having a plurality of second branches, wherein each second branch includes:
  a third capacitor that is coupled to the second comparator;
  a third switch that is coupled to the third capacitor and that receives at least two of the first portion of the input signal, the first portion of the reference signal, and the second portion of the reference signal, wherein the third switch is controlled by the SAR controller;
  a fourth capacitor that is coupled to the second comparator; and
  a fourth switch that is coupled to the fourth capacitor and that receives at least two of the second portion of the input signal, the first portion of the reference signal, and the second portion of the reference signal, wherein the fourth switch is controlled by the SAR controller.

8. The apparatus of claim 7, wherein the second switched capacitor array has 3 branches.

9. The apparatus of claim 7, wherein the second switched capacitor array further comprises a dummy branch having:
  a first dummy capacitor that is coupled to the second comparator and that receives the first portion of the reference signal; and
  a second dummy capacitor that is coupled to the second comparator and that receives the first portion of the reference signal.

* * * * *